(12) United States Patent
Jiang et al.

(10) Patent No.: US 6,601,294 B1
(45) Date of Patent: Aug. 5, 2003

(54) METHOD FOR MAKING A PACKAGED SEMICONDUCTOR DEVICE

(75) Inventors: Tongbi Jiang, Boise, ID (US); Mark S. Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 68 days.

(21) Appl. No.: 09/672,690

(22) Filed: Sep. 29, 2000

Related U.S. Application Data

(62) Division of application No. 09/386,319, filed on Aug. 31, 1999, now Pat. No. 6,208,519.

(51) Int. Cl.[7] .............................. H05K 3/30; H05K 3/34; H05K 7/20; H01K 3/22
(52) U.S. Cl. ............................. 29/841; 29/840; 29/848; 264/272.11; 361/717
(58) Field of Search .................... 29/832, 840, 841, 29/848; 264/61, 272.11, 272.15, 272.17; 156/280; 438/118, 119, 122, 124; 361/717

(56) References Cited

U.S. PATENT DOCUMENTS

| | | | |
|---|---|---|---|
| 5,121,293 A | | 6/1992 | Conte |
| 5,311,060 A | * | 5/1994 | Rostoker et al. ............ 257/796 |
| 5,344,795 A | * | 9/1994 | Hashemi et al. ....... 264/272.15 |
| 5,359,768 A | | 11/1994 | Haley |
| 5,420,752 A | * | 5/1995 | Variot ........................ 361/709 |
| 5,438,478 A | * | 8/1995 | Kondo et al. ................ 361/704 |
| 5,610,442 A | * | 3/1997 | Schneider et al. .......... 257/787 |
| 5,666,003 A | * | 9/1997 | Shibata et al. .............. 257/796 |
| 5,711,069 A | * | 1/1998 | Hundt ..................... 29/890.03 |
| 5,754,401 A | | 5/1998 | Saneinejad et al. |
| 5,901,041 A | | 5/1999 | Davies et al. |

* cited by examiner

Primary Examiner—Carl J. Arbes
Assistant Examiner—Thiem D Phan
(74) Attorney, Agent, or Firm—Dickstein Shapiro Morin & Oshinsky LLP

(57) ABSTRACT

A semiconductor package with thermally enhanced properties is described. The semiconductor package includes a substrate upon which a die is affixed. The die and the substrate each have contacts which are respectively connected with each other. A heat sink is affixed to a surface of the die by way of a thermally compliant material. The compliant material reduces the stresses caused by temperature fluctuations which cause the heat sink and the die to expand and contract at different rates. A first molding material is deposited around the periphery of the die, compliant material and heat sink, thereby leaving exposed substantially an entire surface of the heat sink.

12 Claims, 4 Drawing Sheets

METHOD FOR MAKING A PACKAGED SEMICONDUCTOR DEVICE

This application is a divisional of application Ser. No. 09/386,319, filed on Aug. 31, 1999 now U.S. Pat. No. 6,208,519, which is hereby incorporated by reference.

FIELD OF THE INVENTION

The present invention relates to the packaging of semiconductor devices. More particularly, the present invention relates to a packaged semiconductor device and a method for making it.

BACKGROUND OF THE INVENTION

Semiconductor device packaging techniques are well known. In conventional packaged devices, a die is attached to a substrate, and contacts of each are electrically connected. A heat sink may also be affixed to the die. The die and heat sink are then completely encapsulated, using an overmold (a heated container with a cavity), with a mold material. An example of such a conventional packaged device may be found in U.S. Pat. No. 5,901,041 (Davies et al).

Other conventional methodologies include packaging the die and then adding the heat sink, leaving it exposed. Yet other conventional approaches include taping a heat sink to internal leads of the die and encapsulating the die and heat sink.

Referring now to FIGS. 1 and 2, there is shown a conventional packaged semiconductor die assembly 10 including a substrate 22, a die 12, a heat sink 40, and a package molding 50. The substrate 22 has a first surface 24 and a second surface 26. An opening 28 extends between the surfaces 24, 26.

The die 12 has a first surface 14, a second surface 16, and one or more sides 18. The second surface 16 abuts the first surface 24 of the substrate 22. Electrical contacts 20 are located on the second surface 16 and are connected to electrical contacts 30 on the second surface 26 of the substrate 22. The contacts 20, 30 are connected by wiring 32 which may be printed or bonded.

The heat sink 40 has a first surface 42, a second surface 44, and one or more sides 46. The second surface 44 abuts the first surface 14 of the die 12. The package molding 50 completely encapsulates the die 12 and the heat sink 40. Specifically, the sides 18, 46 and the first surface 42 are covered by the package molding 50.

One problem with such conventional methodologies is that current overmold techniques generally completely encapsulate the head sink with no surface of the heat sink directly exposed as shown in FIG. 2. This reduces efficiency of the heat transfer process.

There thus exists a need for a packaged semiconductor device having a heat sink which allows greater heat transfer properties, particularly as the density of components within a die increases and heat build up becomes more of a problem.

SUMMARY OF THE INVENTION

The present invention provides a packaged semiconductor device which includes a substrate, a die connected to said substrate, a heat sink affixed to said die, and a first molding material encapsulating said die and said heat sink, said first molding material leaving exposed substantially an entire upper surface of the said heat sink.

The present invention further provides a molded packaged semiconductor device including a die having first contacts, a substrate connected to the die and having second contacts, the first contacts being connected to respective second contacts, a heat sink, a thermally compliant material adhering the heat sink with the die, and a molding material encapsulating the die, the thermally compliant material, and the substrate, the molding material leaving exposed substantially the entire upper surface of the heat sink.

The present invention further provides a method for packaging a semiconductor device. The method includes affixing a heat sink to a die located on a substrate, and encapsulating the die and the heat sink with a first molding material such that substantially an entire upper surface of the heat sink remains exposed.

These and other advantages and features of the invention will be more readily understood from the following detailed description of the invention which is provided in connection with the accompanying drawings.

DETAILED DESCRIPTION OF THE PREFERRED EMBODIMENTS

Figure 1:
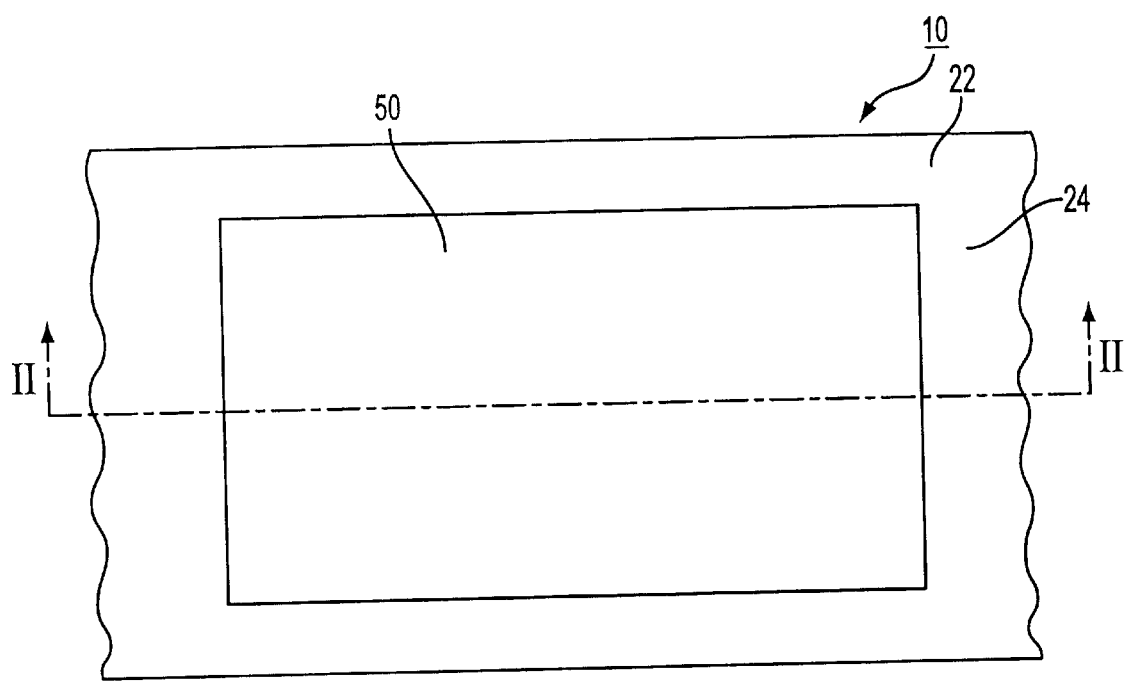
FIG. 1 is a top view of a conventionally molded semiconductor die assembly.
Figure 2:
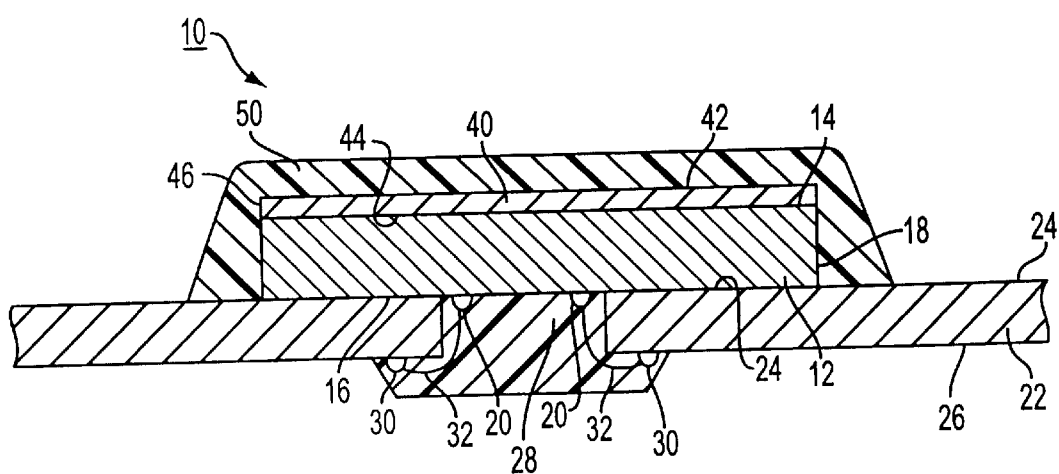
FIG. 2 is a cross-sectional view taken along line II—II of the semiconductor die assembly of FIG. 1.
Figure 3:
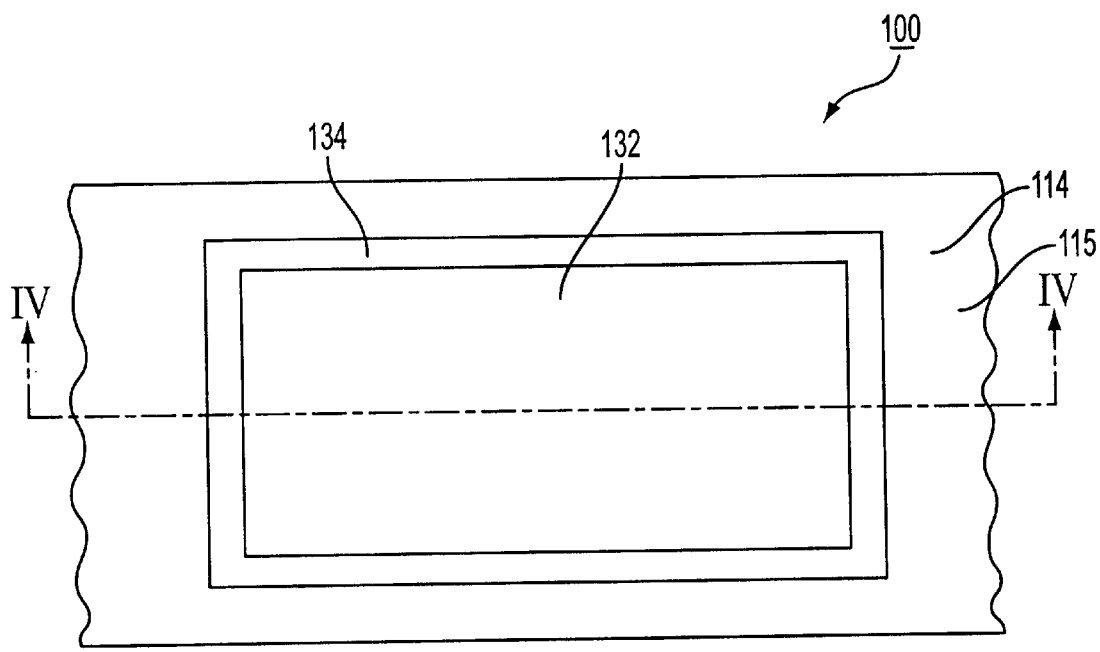
FIG. 3 is a top view of a semiconductor die assembly constructed in accordance with an embodiment of the invention.
Figure 4:
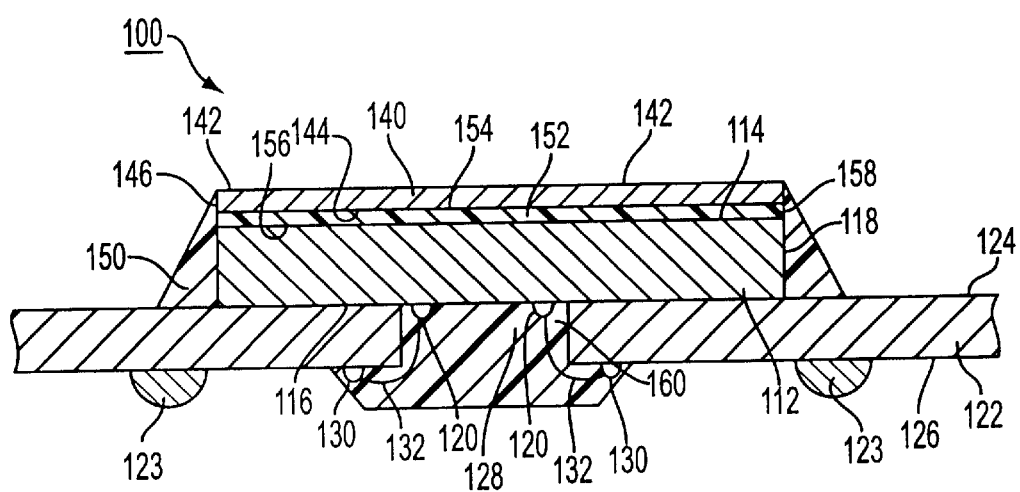
FIG. 4 is a cross-sectional view taken along line IV—IV of the semiconductor die assembly of FIG. 3.

Referring now to FIGS. 3 and 4, where like numerals designate like elements, a semiconductor die assembly 100 is shown having a die 112 and an insulator substrate 122. The substrate 122 includes a opening 128 to allow electrical connection between contacts 120 on a first surface 116 of the die 112 and contacts 130 on a first surface 126 of the substrate 122. Preferably, the assembly 100 is a Rambus ball grid array, which is differentiated from other semiconductor packages in that it is a high frequency, high speed and high power dissipation package.

The die 112 is generally rectangular having, in addition to the first surface 116, a second surface 114 and a plurality of sides 118. The substrate 122 further includes a second surface 124 upon which the die first surface 116 rests. Preferably, the die 112 contains a memory circuit, such as, for example, a DRAM, SRAM, SDRAM or other suitable memory circuit.

A heat sink 140 is located above the die 112. The heat sink 140 includes a first surface 144, a second surface 142, and a plurality of sides 146. The heat sink 140 is formed of a heat conductive material. An example of suitable materials include metals, such as, for example, copper or aluminum, or the oxides thereof.

The heat sink 140 need not, however, be formed completely of a metal. Instead, the heat sink 140 may be formed of a thermally conductive material and be metal plated.

Alternatively, the heat sink 140 may be formed of a film or hardened paste of polymeric material with thermally conductive components embedded therein. The components may be metallic or inorganic, such as silicon nitride. One commercially available material is Thermaxx™ 2600K adhesive made by National Starch and Chemical Company of Bridgewater, N.J., which has a thermal conductivity factor of about twenty Watts/meter-Kelvin (W/mK) to about forty W/mK.

Sandwiched between the heat sink 140 and the die 112 is a thermally conductive compliant material 152. The compliant material 152 has a first surface 156 which contacts the die second surface 114 and a second surface 154 which contacts the heat sink first surface 144. The material 152 further has a plurality of sides 158. The material 152 is preferably an adhesive which serves to dissipate thermal stress caused by differing thermal expansions for two adhered materials, in this case the die 112 and the heat sink 140. That is, it allows for some relative movement between the two during use when they become heated. An example of the material 152 is QMI 506, a bismaleimide material, which is a silver-filled adhesive manufactured by Quantum Material, Inc. of San Diego, Calif.

For example, a heat sink 140 formed of copper has an expansion factor of $15-17 \times 10^{-6°}$ C., while the expansion factor of a die 112 is about $3 \times 10^{-6°}$ C. The thermally conductive compliant material 152 assists in dissipating stresses caused by the relative expansions between the die 112 and the heat sink 140. The thermally conductive compliant material 152 is particularly useful in applications where the die 112 is a large semiconductor die, such as, for example, a die in the range of about 500 mils.

The die 112, material 152 and heat sink 140 are encapsulated within a molding material 150. The molding material 150 encapsulates the sides 118, 158 and 146 of, respectively, the die 112, the thermally compliant material 152 and the heat sink 140. While the molding material 150 may encroach slightly above the sides 146 of the heat sink 140, in general the molding material 150 does not cover the heat sink second (upper) surface 142.

An advantage in leaving exposed the second surface 142 of the heat sink 140 is that the exposed surface 142 provides enhanced thermal dissipation to the assembly 100. For example, a conventional Rambus ball grid array package operates at a temperature of about 100° C. By leaving exposed the outer heat sink surface 142, such a package would operate about 10° C. cooler.

Another advantage is that the semi-exposed heat sink 140 provides greater protection against mechanical and chemical stress and against moisture. Further, the exposed surface 142 provides a surface upon which identifying marks and/or alphanumeric symbols may be formed.

The contacts 120 and the wiring 132 are encapsulated by a molding material 160 which is preferably the same as molding material 150. Encapsulating the contacts 120 and the wiring 132 protects them against damage from corrosion and/or shock.

Figure 6:
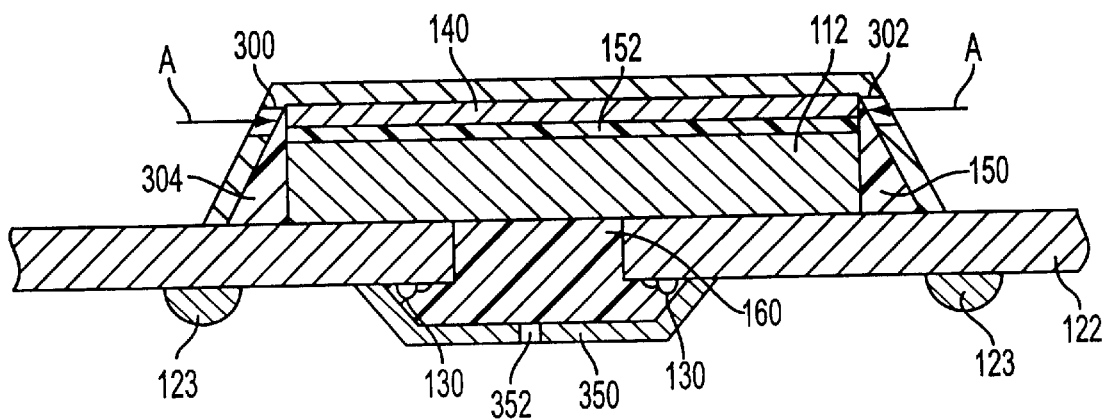
FIG. 6 is a cross-sectional view showing injection of a mold around a die in accordance with an embodiment of the invention.

The molding material 150 may be placed around the die 112 by locating a heated cavity around the die 112 and injecting the molding material 150 in a semi-liquid or gel state (FIG. 6) into the cavity. The molding material 150 then cures and hardens. FIG. 6 shows a first mold cavity 300 and a second mold cavity 350 used for the injection of, respectively, the molding materials 150 and 160. The cavity 300 includes a plurality of openings 302 extending into a cavity area 304. The cavity area 304 may be heated by a suitable heating source (not shown) which is well known in the industry. Molding material 150 is injected in the direction of arrows A through the openings 302 into the cavity area 304.

Likewise, the mold cavity 350 has one or more openings 352. The molding material 160 is injected in the direction of arrow B into the cavity 350. The contacts 120, 130 and the wiring 132 are not shown in FIG. 6 for simplicity of illustration.

Alternatively, the molding material 150, as well as the molding material 160, may be positioned about the die 112 by dispensing a liquid epoxy, also known as a glob top, where desired. The glob top cures to form the molding materials 150, 160 as shown in FIGS. 3, 4 and 6.

An additional advantage of the thermally compliant material 152 is that it prevents any of the molding material 150 being injected into the heated cavity 304 from entering between the heat sink first surface 144 and the die second surface 114. Thus, the compliant material 152 not only insures good contact between the heat sink 140 and the die 112, because it is compliant it also ensures that there is a no gap in the area between the upper surface of the heat sink 140 and the mold cavity 300. To further insure that no molding material 150 gets between the upper surface of the heat sink 140 and the mold cavity 300, a biasing force may be exerted on the heat sink 140 in the direction of the die 112 during the molding process.

Figure 5:
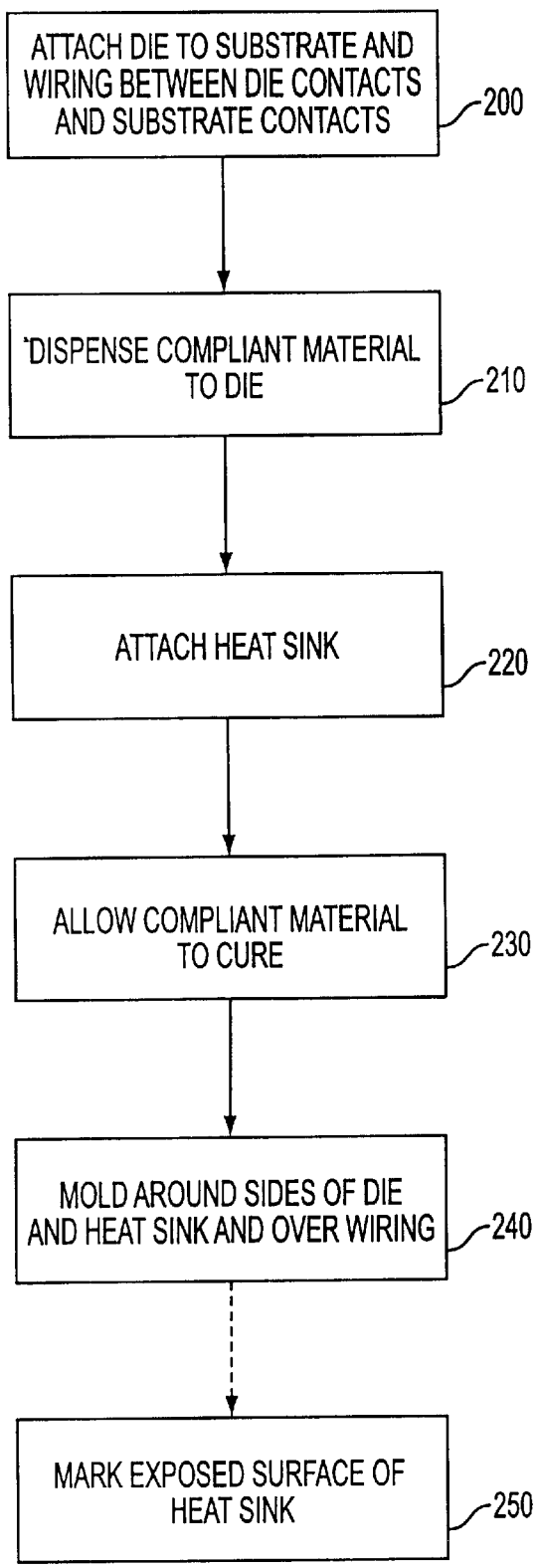
FIG. 5 is a flow chart of steps used in manufacturing the semiconductor die assembly of FIG. 3.

Referring now to FIG. 5, next will be described a method of packaging a semiconductor device. First, at step 200, the die 112 is affixed to the substrate 122 and the wiring 132 is applied between the contacts 120 and respective contacts 130. As noted, this may be through a wire bonding or a printed contact.

The thermally conductive compliant material 152 is dispensed at step 210. The material 152 may be an adhesive, such as the silver-filled bismaleimide material described above. At step 220, the heat sink 140 is attached to the die 114 through the compliant material 152. The material 152 is then cured at step 230.

Step 240, is the application of the molding material 150 to the sides 118, 158, and 146 of, respectively, the die 114, the compliant material 152, and the heat sink 140. The application of the molding material 150 may be through cavity injection, as described above, or by another suitable method, such as through glob top dispensing. Optionally, at step 250, the exposed surface 142 of the heat sink 140 may be marked, either by laser or by other suitable marking structure.

The present invention provides a packaged semiconductor device with enhanced thermal stress reduction, environmental protection and enhanced thermal dissipation properties stemming from an exposed heat sink. The present invention further provides a method for packaging a semiconductor package leaving an exposed surface of the heat sink without encountering the problem of having the molding material leak onto an upper surface of the heat sink during the molding operation.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method for packaging a semiconductor device, comprising:

affixing a heat sink directly to a die located on a substrate, said substrate including an opening and said heat sink including a planar and substantially rectangular surface;

encapsulating said die and said heat sink with a first molding material such that said surface of said heat sink remains exposed; and encapsulating said opening with a second molding material.

2. The method of claim 1, further comprising electrically connecting first contacts on the die with respective second contacts on the substrate.

3. The method of claim 2, wherein said encapsulating said opening includes encapsulating the first contacts with said second molding material.

4. The method of claim 3, wherein said first and second molding material comprises the same material.

5. The method of claim 3, wherein said encapsulating with the second molding material comprises dispensing the second molding material as a liquid around the first contacts.

6. The method of claim 1, wherein said encapsulating with the first molding material comprises:

placing a mold cavity over the die and heat sink; and injecting the first molding material into the cavity.

7. The method of claim 1, wherein said encapsulating with the first molding material comprises dispensing the first molding material as a liquid around the die and the heat sink.

8. The method of claim 1, wherein said affixing comprises locating a thermally conductive compliant material between the die and the heat sink.

9. The method of claim 8, wherein said affixing comprises locating a thermally conductive compliant adhesive between the die and the heat sink.

10. The method of claim 8, further comprising curing the thermally conductive compliant material.

11. The method of claim 8, wherein the thermally conductive compliant material comprises a material which lessens thermal stress between the die and the heat sink.

12. The method of claim 1, further comprising marking the exposed surface of the heat sink.

\* \* \* \* \*

UNITED STATES PATENT AND TRADEMARK OFFICE
CERTIFICATE OF CORRECTION

PATENT NO. : 6,601,294 B1  Page 1 of 1
DATED : August 5, 2003
INVENTOR(S) : Tongbi Jiang et al.

It is certified that error appears in the above-identified patent and that said Letters Patent is hereby corrected as shown below:

<u>Column 3,</u>
Line 25, delete "15-17x10$^{-6o}$ C.," and insert -- 15-17x10$^{-6}$ $^0$C., --;
Line 26, delete "3x10$^{-6o}$ C." and insert -- 3x10$^{-6}$ $^0$C. --.

Signed and Sealed this

Thirteenth Day of January, 2004

JON W. DUDAS
*Acting Director of the United States Patent and Trademark Office*